United States Patent [19]
Ichinose et al.

[11] Patent Number: 6,008,451
[45] Date of Patent: Dec. 28, 1999

[54] PHOTOVOLTAIC DEVICE

[75] Inventors: Hirofumi Ichinose, Tokyo; Akio Hasebe, Nagahama; Tsutomu Murakami, Nara; Satoshi Shinkura, Nagahama; Yukie Ueno, Nara, all of Japan

[73] Assignee: Canon Kabushiki Kaisha, Tokyo, Japan

[21] Appl. No.: 08/907,076

[22] Filed: Aug. 6, 1997

[30] Foreign Application Priority Data

Aug. 8, 1996 [JP] Japan ............................ 8-224670

[51] Int. Cl.$^6$ .................................................. H01L 31/00
[52] U.S. Cl. ................................................... 136/256
[58] Field of Search .................................... 136/256

[56] References Cited

U.S. PATENT DOCUMENTS

| | | | |
|---|---|---|---|
| 4,256,513 | 3/1981 | Yoshida et al. | 136/256 |
| 4,260,429 | 4/1981 | Moyer | 136/256 |
| 5,063,128 | 11/1991 | Yuh et al. | 430/63 |
| 5,084,107 | 1/1992 | Deguchi et al. | 136/256 |
| 5,259,891 | 11/1993 | Matsuyama et al. | 136/244 |
| 5,380,371 | 1/1995 | Murakami | 136/256 |
| 5,681,402 | 10/1997 | Ichinose et al. | 136/256 |

*Primary Examiner*—Mark Chapman
*Attorney, Agent, or Firm*—Fitzpatrick, Cella, Harper & Scinto

[57] ABSTRACT

A photovoltaic device is provided which comprises a semiconductor layer, and an electrode comprising an electrode member and an conductive resin layer, wherein the electrode member has a constitution of a complex of a core and a periphery, and the periphery contains no particle with a particle size larger than 2 $\mu$m. The electrode of this photovoltaic device exhibits high current collecting efficiency and is reliable in long use term.

17 Claims, 4 Drawing Sheets

PHOTOVOLTAIC DEVICE

BACKGROUND OF THE INVENTION

1. Field of the Invention

The present invention relates to a current collecting electrode of a photovoltaic device which has excellent initial characteristics, and high humidity resistance and high reliability throughout a long use term.

2. Related Background Art

In conventional photovoltaic devices, an electrode is formed in a comb-shape pattern so as not to intercept incident light, and to keep the series resistance low. The electrode is formed from a metal exhibiting satisfactory ohmic contact to Si by direct deposition of the metal on Si by vacuum deposition or by a sputtering method, or deposition by an electroless plating method.

Such methods, however, require a vacuum process, or a mask for patterning, and take a long time, which is disadvantageous in mass-production. In an alternative process, an electroconductive resin is applied in an electrode shape by screen printing and is baked as an electrode. This process is suitable for mass-production because of the high throughput.

In the solar cell for general home use, for example, when an output of about 3 kW is required and the conversion efficiency is 10%, the cell requires a large area, as large as 30 m². Such a large solar cell requires a busbar for collecting the current from the electrode, which needs additional manufacturing processing.

The larger solar cell has necessarily more defects, and the defects will cause short-circuiting or shunting, which lowers significantly the conversion efficiency. The defects which are apart from the electrode or the busbar cause less current loss owing to the resistance against the current flowing into the defective portions, whereas the defects which are under the electrode or the busbar cause larger current losses.

To solve the problems in collecting current from the electrodes formed by the screen printing as described above by using the busbar, and to form electrodes suitable for a solar cell of a large area, U.S. Pat. No. 4,260,429 discloses a method in which a copper wire is coated with a solid polymer containing electroconductive particles to form an electrode and the electrode is attached on a photoelectric cell; and U.S. Pat. No. 5,084,107 discloses a method in which a metal wire is fixed via an electroconductive adhesive on an electrode position on a photovoltaic device. Such an electrode constituted of an electroconductive wire coated with a solid polymer containing electroconductive particles (electroconductive adhesive) can keep the ohmic loss low even with an electrode of longer than 10 cm effectively.

The above prior art techniques involve the following problems however:

In U.S. Pat. No. 4,260,429, no special treatment is given to the surface of the electroconductive wire or of the metallic member. Generally, when an electrode is prepared from an electroconductive wire or a metal of readily oxidizable material such as copper without surface treatment according to the disclosed method, the surface of the conductive wire or the metal will be oxidized, not giving sufficient adhesion at the interface between the surface of the conductive wire and the solid polymer containing electroconductive particles or the electroconductive adhesive. Further, the surface oxidation proceeds under the influence of moisture to weaken the adhesion.

Moreover, without special treatment of the electroconductive wire or metallic member, initial power loss is caused in the solar cell, and separation occurs at the adhesion interface to increase the series resistance and lower the conversion efficiency during a long use term, thus impairing the reliability.

In U.S. Pat. No. 5,084,107, the wire material of a metal such as copper, or of an alloy of mainly composed of copper is plated with another metal or alloy. Usually, the plating of the wire is conducted batch-wise with the metal wire cut in a predetermined length, so that the wire is liable to be curved undesirably or to cause defective plating because of the batch plating treatment of the cut wire. The batch treatment increases the number of the production steps, disadvantageously. In the film formation by plating, the plating conditions such as the electric current density, the bath concentration, the bath temperature, and the bath stirring should be strictly adjusted to control the crystal nucleus formation and the crystal growth rate. A larger diameter of the crystal particle in the film causes diffusion of the metal on the inside of the film by heat or moisture. When the metal members are not completely coated with the resin, adhesiveness to the photovoltaic device varies, causing problems of electromigration or the like by the metal ions of the metal members due to the influence of moisture.

SUMMARY OF THE INVENTION

An object of the present invention is to provide a photovoltaic device and a process for producing the photovoltaic device having excellent properties to solve the above problems of the power loss in the initial stage, increase of the series resistance, and moisture leakage during a long use term.

To solve the above problems, the inventors of the present invention have made study comprehensively to improve adhesion and electroconductivity between the electrode member and the electroconductive resin layer. As a result, the inventors of the present invention have found that the above object can be accomplished by constituting the electrode member in a state of a complex of a core and a periphery, and by controlling the average size of the crystal particles of material for forming the periphery and the thickness of the periphery. The present invention has been accomplished based on the above findings.

The photovoltaic device of the present invention comprises a semiconductor layer, and an electrode comprising an electrode member and an electroconductive resin layer, wherein the electrode member has a constitution of a complex of a core and a periphery, and the periphery is not formed by particles with a particle size larger than 2 $\mu$m, that is, the periphery is formed by particles with a particle size of 2 $\mu$m or less.

The photovoltaic device having such a constitution exhibits high current collecting efficiency and is reliable in a long term use.

DESCRIPTION OF THE PREFERRED EMBODIMENTS

Figure 1A:
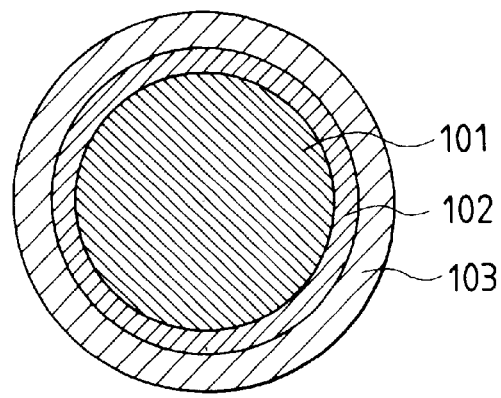
FIG. 1A and FIG. 1B are schematic sectional views illustrating the constitution of an electrode of the present invention.
Figure 1B:
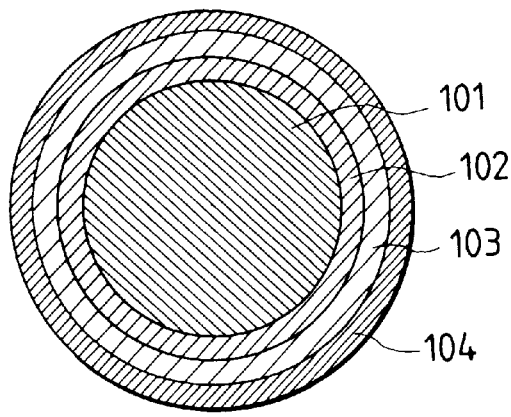
Figure 2:
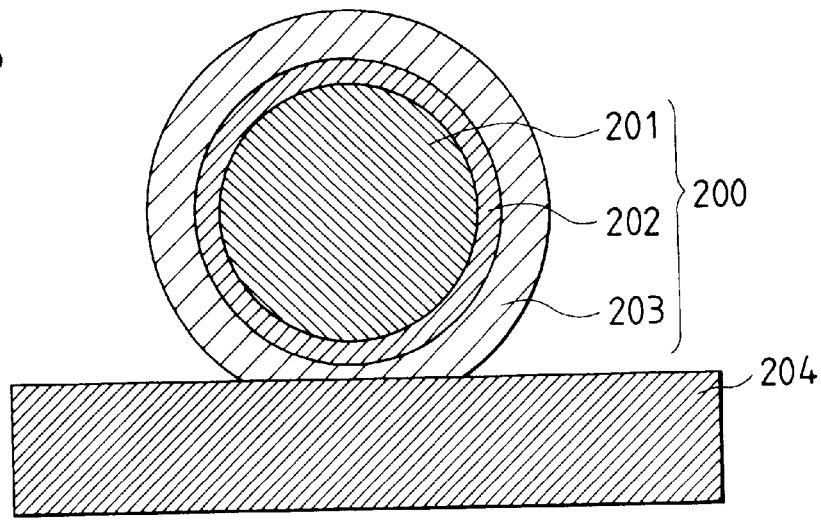
FIG. 2 is a schematic sectional view illustrating a state of adhesion of the electrode to the photovoltaic cell.

FIG. 1A and FIG. 1B are schematic sectional views illustrating the constitution of an electrode of the present invention. The electrode of the present invention is constituted of a core 101, a periphery 102, and a conductive resin layer 103. The combination of the core 101 and the periphery 102 constitute an electrode member which is the main electric current path. The electrode may have a linear shape or a foil shape. FIG. 2 shows an example of two-layer structure of the conductive resin layer.

(Core 101)

The cross-section of the core 101 may be circular or rectangular as desired. The material for the core 101 is not limited provided that it has high conductivity and is readily workable into a fine wire, and includes copper, copper alloys, aluminum and the like. A specific example is a wire of copper or the like of 25 µm to 1 mm diameter for enameled wires shown in JIS C3202. The metal wire is drawn to a desired diameter by a wire drawing machine. The drawn metal wire, which is hard, may be made soft by annealing for desired ease for expanding and curving.

(Periphery 102)

A periphery 102 is provided on the surface of the core 101 for prevention of corrosion and oxidation of the core, improvement of adhesiveness to the conductive resin layer, and improvement of electric conduction. The suitable material for the periphery 102 includes metals and metal oxides which are insensitive to humidity and have a good resistance to corrosion. Examples thereof include silver, platinum, gold, nickel, and tin, and metal oxides. The metal oxides include ITO ($In_2O_3+SnO_2$), $In_2O_3$, $SnO_2$, $TiO_2$, and ZnO.

In formation of the periphery, it is important to control the size of particles observed in a material forming the periphery 102. The inventors of the present invention have found that the absence of particles with a particle size larger than 2 µm in the periphery offsets the influence of moisture and prevents diffusion of the material of the core 101, and is effective for maintaining the performance of the photovoltaic device.

The thickness of the periphery 102 is decided depending on the average crystal particle diameter and the material for the core 101. When the thickness of the periphery 102 is 1% or more of the diameter of the electrode member, the smoothness of the periphery can be maintained, and the formation of the periphery 102 is ensured without formation of a pinhole to keep weatherability. The thickness of the periphery 102 is suitably 20% or less of the diameter of the electrode member, and when it is larger than 20%, a shadow loss is made larger.

The periphery 102 can be formed by a cladding method in which the electrode member is formed by stretch working to obtain a cladded complex. By the cladding, the periphery 102 can be preferable formed uniformly and integrally without formation of crystal particles with a particle size larger than 2 µm and without formation of a pinhole. In the cladding method, the material of the periphery 102 is wound around the material of the core 101 to coat it, and the coated material is stretched by drawing, rolling, swaging, or the like. In this process, the material of the core 101 diffuses into the periphery 102 to increase of the adhesiveness at the interface to the periphery 102. Further, the stretched material is subjected to annealing, if necessary Alternatively, the periphery can be formed by vacuum film formation such as sputtering, and vapor deposition.

When electrolytic plating is employed, strict control is required in the conditions of the current density, the plating bath concentration, the plating bath temperature, and stirring in order to control the average crystal particle diameter of the material constituting the periphery 102, and moreover, the core 101, the periphery 102, and the conductive resin layers 103 and 104 cannot readily be formed in a continuous process.

The diameter of the electrode member is selected to minimize the sum of the shadow loss and the ohmic loss of the photovoltaic device. Specifically, the diameter ranges preferably from about 25 µm to 200 µm.

(Conductive resin layers 103 and 104)

The conductive resin layer has functions of inhibiting penetration of moisture into the electrode member and preventing migration of the metal ions from the electrode member, fixing the electrode member to the photovoltaic cell by adhesion, and collecting the electric current. The conductive resin layer is preferably formed concentrically to coat the periphery of the electrode member.

To have such functions, the conductive resin layer comprises a resin and conductive particles. The resin may be either thermosetting or thermoplastic, and is preferably less moisture-permeable. Such resins include epoxy resins, urethane resins, butyral resins, phenol resins, melamine resins, alkyd resins, polyester resins, polyimide resins, and fluorine-based resins.

The materials for the conductive particles include graphite, carbon black, $In_2O_3$, $TiO_2$, $SnO_2$ ITO, and ZnO, and oxide semiconductor materials prepared by adding a dopant to any of the above materials.

The diameter of the conductive particles should be smaller than the thickness of the formed conductive resin layer. However, excessively smaller particles make higher the resistance at the contact points between the particles, not giving the desired specific resistance. Therefore, the diameter of the conductive particles is preferably in the range of from 0.02 µm to 15 µm.

The conductive particles and the resin are mixed at a suitable ratio to obtain a desired resistance. A larger amount of the conductive particles lowers the specific resistance, but reduces the ratio of the resin to impair the stability of the conductive resin layer. Therefore, the ratio is suitably selected depending on the kind of the resin, the kind of the conductive particles and the desired properties. The content of the conductive particles is preferably in the range of from about 5% to about 95% by volume.

The mixing of the conductive particles and the resin is conducted by a dispersion means such as a three-roll mill and a paint shaker. During or after the dispersion, a solvent may be added to adjust the viscosity of the conductive resin.

The conductive resin layer may be constituted of a single layer, or may be constituted of two or more layers, as shown in FIG. 1B, which separately have a ion-barrier function, a current collection function, an adhesion function, and so forth for the layers.

At least the conductive resin layer 103 in direct contact with the electrode member preferably covers completely the electrode member to achieve the effect of the present invention, and more preferably covers it uniformly.

The conductive resin layer 103 in direct contact with the electrode member has preferably a glass transition temperature of 100° C. or more to obtain a higher protection of the electrode member and to be stable in a special overcoating process or heating or cooling in lamination process after formation of the conductive resin layer. Naturally, the glass transition temperature of the thermosetting resin indicates the glass transition temperature of the resin after curing.

The specific resistance of the conductive resin layer should be negligible in collecting the current generated by the photovoltaic device, and is in a suitable range not to cause shunting, preferably in the range of from about 0.1 to about 100 Ωcm.

The porosity (void volume) of the conductive resin layer is preferably 0.04 ml/g or less in measurement of voids with a radius of 1 μm or less in order to have a higher barrier effect against metal ions and for the function of blocking layer against ionic substances. This prevents penetration of moisture from the outside and migration of metal ions, and increase in the resistance due to deterioration of the bonding between the conductive particles and the resin of the conductive resin layer.

The thickness of the conductive resin layer is selected depending on the diameter of the electrode member, and the desired properties. For example, when a metal wire has a circular cross-section, the thickness preferably ranges from 1% to 80% of the diameter of the electrode member to form the layer without no pinhole and with sufficient barrier function, sufficient adhesiveness and electroconductivity, and to avoid larger shadow loss.

The outermost layer 104 of the conductive layer may be formed from either a thermoplastic resin or a thermosetting resin. The thermoplastic resin is preferably a hot-melt type for adhesion by thermal softening. When the thermosetting resin is used, the electrodes can be stored as parts by drying only the solvent, and keeping the conductive resin layer in an uncured state until bonding to the photovoltaic cell.

The conductive resin layer can be suitably formed according to a coating method of an enameled wire. Specifically, the aforementioned conductive resin is diluted with a solvent to obtain a suitable viscosity, the dilute resin is applied onto the electrode member by means of a roll coater or the like to coat it, the coated electrode member is passed through a dice to control the layer thickness, and then the coating layer is dried and cured by IR heating or the like. Alternatively, the conductive resin layer can be formed by an immersion method.

(Embodiment of Photovoltaic Device)

FIG. 2 illustrates the state of fixation of the electrode 200 onto the surface of the photovoltaic cell 204 by melting and solidifying the conductive resin layer 203 which is the outermost layer of the electrode. The photovoltaic cell 204 includes a silicon based single-crystal, a polycrystal, an amorphous semiconductor, a compound semiconductor, and a Schottky junction type photovoltaic cells. The amorphous semiconductor includes microcrystalline semiconductors. The surface in contact with the electrode 200 may be the surface of a semiconductor layer or a transparent conductive layer such as ITO.

Figure 3A:
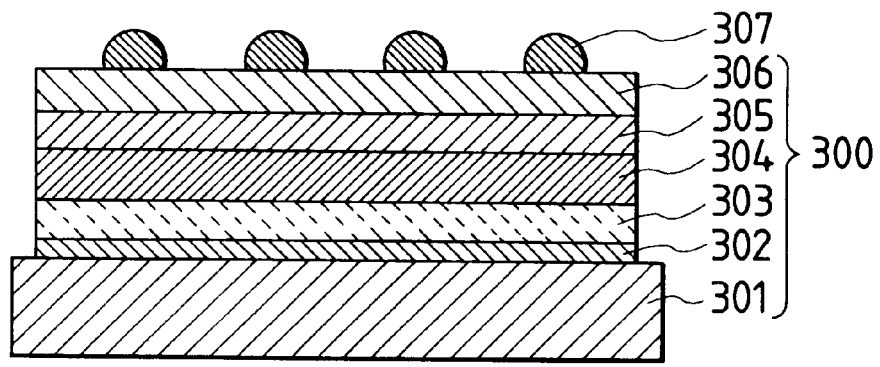
FIG. 3A and FIG. 3B are schematic sectional views illustrating the constitution of a photovoltaic device of the present invention.
Figure 3B:
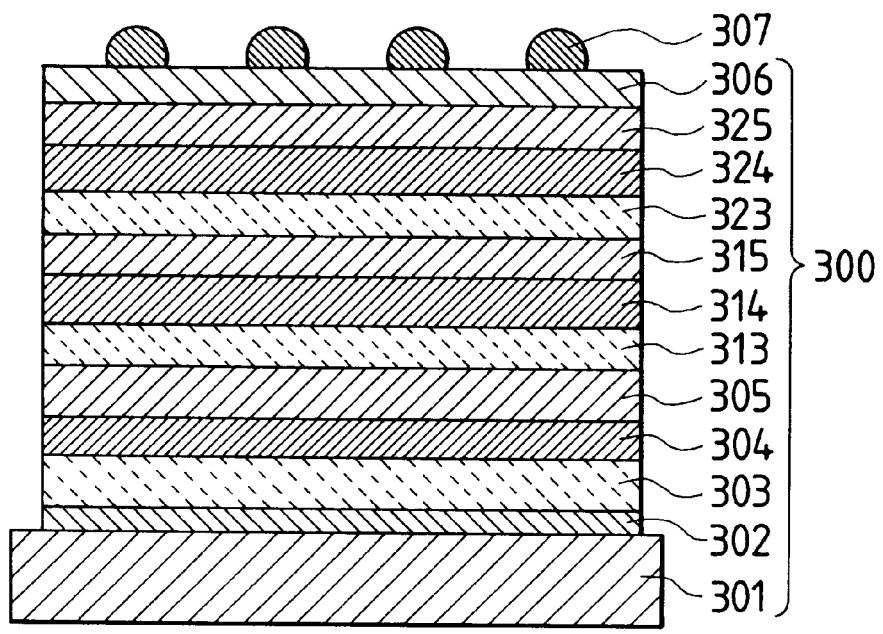

FIG. 3A and FIG. 3B are schematic sectional views illustrating the constitution of a photovoltaic device having the electrode according to the present invention, which comprises a substrate 301, single-crystal semiconductors having a pin junction and electrodes 307. In the photovoltaic cell 300, a lower electrode 302, an n-layer 303, an i-layer 304, a p-layer 305, a transparent layer 306, and current collecting electrodes accoding to the present invention are successively stacked on a substrate 301.

(Substrate 301)

The substrate 301 is a member for mechanically supporting the semiconductor layers 303 to 305 such as of an amorphous silicon for a thin film photovoltaic device, and occasionally used as the electrode. The substrate 301 requires a heat resistance for the heating temperature for film formation of semiconductor layers 303 to 305, and may be either electrically conductive or insulating.

The conductive material for the substrate includes specifically thin plates of metals such as Fe, Ni, Cr, Al, Mo, Au, Nb, Ta, V, Ti, Pt, Pb, and Ti, and alloys thereof such as brass and stainless steel, and composite plates thereof; carbon sheet and zinc-plated steel sheet.

The electrical insulating material for the substrate includes films and sheets of a heat-resistant synthetic resin such as polyesters, polyethylenes, polycarbonates, cellulose acetates, polypropylenes, polyvinyl chlorides, polyvinylidene chlorides, polystyrenes, polyamides, polyimides, and epoxy resins; composites of the above resins with glass fiber, carbon fiber, boron fiber, metal fiber, or the like; thin plates of the aforementioned electrical conductive materials or sheets of the resins the surface of which is coated with a thin film of another metal and/or a insulating thin film of $SiO_2$, $Si_3N_4$, $Al_2O_3$, AlN, or the like by sputtering, vapor deposition, plating, or a like method; glass; and ceramics. A long sheet of the substrate can be applied to a roll-to-roll production of the photovoltaic cell.

(Lower Electrode 302)

The lower electrode 302 is one of the pair of electrodes for taking out the electric power generated in the semiconductor layers 303 to 305, and is required to have a work function for an ohmic contact to the semiconductor layer 303. The material therefor includes metals and alloys, and transparent conductive oxide (TCO) such as Al, Ag, Pt, Au, Ni, Ti, Mo, W, Fe, V, Cr, Cu, stainless steel, brass, nichrome, $SnO_2$, $In_2O_3$, ZnO, and ITO.

The surface of the lower electrode 302 is preferably smooth. However, the surface may be textured for irregular reflection. When the substrate 301 is conductive, the lower electrode need not be specially provided.

The lower electrode 302 is prepared by plating, vapor deposition, sputtering, or the like. The transparent electrode can be prepared by resistance-heating vapor deposition, electron beam-heating vapor deposition, sputtering, spraying, or the like.

(Semiconductor Layer)

The amorphous silicon semiconductor materials (hereinafter, the amorphous silicon is referred to as "a-Si") includes amorphous semiconductors based on the elements of Group IV and on the alloy of Group IV of the Priodic Table, for example, a-Si:H, a-Si:F, a-Si:H:F, a-SiGe:H. a-SiGe:F, a-SiGe:H:F, a-SiC:H, a-SiC:F, and a-SiC:H:F.

The amorphous silicon semiconductor layer can be formed by a known process including vapor deposition, sputtering, RF plasma CVD, microwave plasma CVD, ECR, thermal CVD, and LPCVD. Industrially preferred is RF plasma CVD in which a source gas is decomposed by RF plasma and is deposited on a substrate. RF plasma CVD involves the problems of low efficiency (about 10%) of the source gas and low deposition rate of about 1 Å/sec to about 10 Å/sec. Microwave plasma CVD is improved in the above film formation. The film formation is conducted by a known reaction apparatus of a batch type or continuous type of film forming apparatus.

For improvement of spectral sensitivity and voltage, the photovoltaic device according to the present invention may employ a tandem cell or a triple cell in which two or more of the pin junctions are deposited. FIG. 3B shows an example of a photovoltaic cell having three pin junctions which is produced by adding two pin junctions of 313 to 315 and 323 to 325 to the photovoltaic cell of FIG. 3A.

(Transparent Electrode 306)

The transparent electrode 306 serves to take out the electromotive force generated in the semiconductor layers 303 to 305, and is a counter electrode to the lower electrode 302. The transparent electrode 306 is necessary for a semiconductor having a high sheet resistance such as amorphous silicon, but is not necessary for a crystal type photovoltaic cell owing to low sheet resistance.

The transparent electrode 306 preferably transmits light at a transmittance of 85% or higher for effective absorption of light from the sun or a white fluorescent lamp to the semiconductor layer. The transparent electrode has preferably a sheet resistance of 100 $\Omega/cm^2$ or more for flow of the current generated by the light in the direction lateral to the semiconductor layer.

The material for transparent electrode having such properties includes metal oxides such as $SnO_2$, $In_2O_3$, $ZnO$, $CdO$, $CdSnO_4$, and ITO.

(Current Collecting Electrode 307)

The current collecting electrodes 307 are preferably arranged on the light-receiving face side of the photovoltaic cell 300, and in parallel at a suitable intervals. The highest efficiency can be achieved by optimizing the pitch of the arrangement: finer pitch for smaller diameter of the electrodes, and larger pitch for larger diameter of the electrodes.

The collecting electrodes can be bonded and fixed to the electrodes by heat and/or pressure. The electrode having a thermoplastic resin layer as the outermost layer of the conductive resin layers can be softened and allowed to adhere by heating. When a thermosetting resin is used as the outermost layer of the conductive resin layers, the resin is dried after application onto the electrode member to remove the solvent without curing. The resin is cured later at the time of adhesion by heating. Thereby, the photovoltaic device can be produced at a low cost with high production yield because neither a special apparatus nor a special environment like a vacuum system is required.

Figure 4:
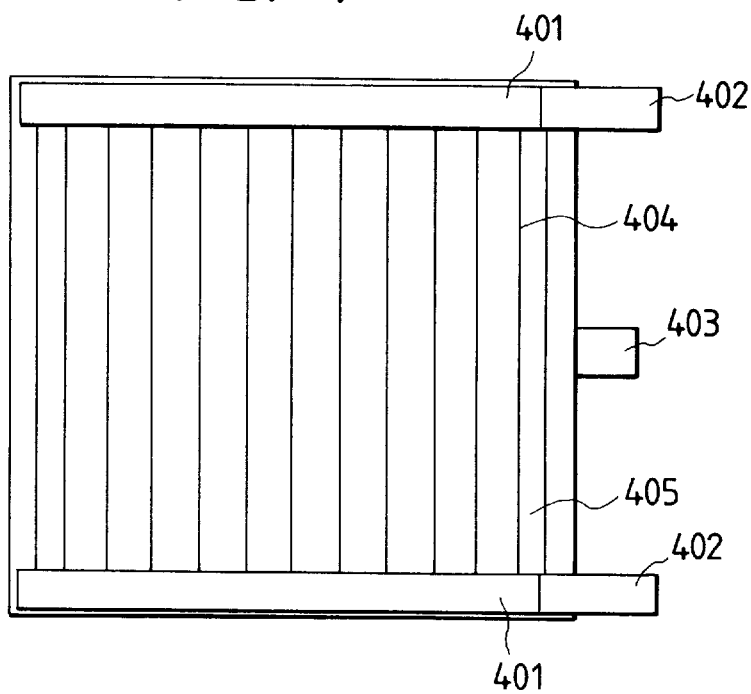
FIG. 4 is a schematic plan view illustrating the constitution of a photovoltaic device of the present invention.

FIG. 4 is a plan view of the photovoltaic cell of FIG. 3A and FIG. 3B. The plural electrodes 404 are fixed onto a transparent electrode 405, and are connected to the lower surface of the busbars 401 provided at the ends of the cell. The busbar 401 is made from a metal such as Cu, Ag, and Pt, or an alloy thereof in a form of a sheet, a tape, or a foil, and is preferably fixed by an adhesive or the like. The electric power of the lower electrode is taken out from a cathode tab portion 403, and the electric power of the busbar 401 is taken out from the anode tab portions 402 to the outside. The collecting electrodes may be connected to the upper surface of the busbar 401.

The photovoltaic device prepared as described above is modularized by encapsulation with a resin by a known method to maintain the weatherability and mechanical strength in outdoor use as the solar cell. For example, EVA (ethylene-vinyl acetate resin) is useful as the encapsulation resin in view of the adhesiveness to the photovoltaic device, the weatherability, and buffering effect. A modulating base material may be used.

For improvement of moisture resistance and scratch resistance, a fluorine-based resin is stacked as a surface protection layer. Examples of the fluorine-based resin include tetrafluoroethylene polymers TFE (e.g., Teflon produced by DuPont Co.), tetrafluoroethylene-ethylene copolymers ETFE (e.g., Tefzel produced by DuPont, Co.), polyvinyl fluoride (e.g., Tedlar produced by DuPont Co.), and polychlorofluoroethylene CTFE (e.g, Neoflon produced by Daikin Industries, Ltd.). A known UV-absorbing agent may be added to these resins to improve their weatherability.

The encapsulation is preferably conducted by hot-pressing the above resin film to the photovoltaic cell under vacuum by means of a known apparatus such as a vacuum laminator.

The constitution of the photovoltaic device of the present invention is described below in detail referring to Examples without limiting the invention.

EXAMPLE 1

A photovoltaic device having a pin junction type triple constitution as shown in FIG. 3B was produced as an example of the present invention.

Firstly an electrode as shown in FIG. 1A is prepared in a manner as described below. A copper wire of 4 to 5 mm in diameter was prepared as the core 101 and was fitted and covered with a silver pipe. The covered wire was worked by means of a wire drawing apparatus to produce a silver-clad copper wire of 100 μm diameter as an electrode member. The diameter of the electrode was controlled to be 95 μm, and the thickness of the silver cladding as the periphery 102 was controlled to be 5 μm (5.3% of the diameter of the electrode member). A sample of the silver-clad copper wire was observed by SEM at the cross-section and the surface thereof to find uniform thickness of the layer, absence of silver crystal particles with a particle size 1 μm or more, and formation of a fine, dense and flat film. The silver-clad copper wire was continuously produced and wound up to a bobbin.

On the surface of the wire, a conductive resin layer 103 was applied by an application machine for an enameld wire. Firstly, the silver-clad copper wire was wound off the bobbin, and oily matter was eliminated from the surface by use of acetone. The wire was then allowed to pass through a treatment vessel which contains a felt impregnated with a conductive resin solution. This conductive resin solution was prepared by dispersing 25 parts by weight of carbon black, 65 parts by weight of a urethane resin, 10 parts by weight of a blocked isocyanate as the curing agent, and 80 parts by weight of a mixture of IPA and ethyl acetate as the solvent by means of a paint shaker. After application, the superfluous conductive resin was removed by a die. The coated wire was dried by passing a drying oven without causing curing of the resin, and was wound up by a reel bobbin.

Thus a silver-clad copper wire was coated with a conductive resin layer 103 to produce an electrode. The layer thickness of the conductive resin layer 103 was adjusted to 25 μm (26.3% of the diameter of the electrode member) by controlling the delivery speed of the wire, and the diameter of the dice. A sample of the wire coated with the conductive resin layer 103 was observed by SEM at the cross-section and the surface thereof to find the formation of the conductive resin layer 103 with a uniform thickness without formation of pinholes.

Separately, a lower electrode 302 composed of Ag and ZnO was formed on a SUS substrate 301. Thereon, successively a bottom layer was formed in the order of an n-layer 303, an i-layer 304, and a p-layer 305; a middle layer was formed in the order of an n-layer 313, an i-layer 314, and a p-layer 315; and a top layer was formed in the order of an n-layer 323, an i-layer 324, and a p-layer 325, which were semiconductor layers, thereby producing a triple cell.

An ITO film was formed thereon as a transparent electrode 306 which is a transparent conductive film serving also as a reflection-prevention film. The film was formed at a formation temperature of 450° C. in a film thickness of 700 Å.

Subsequently, the wire electrodes prepared as described above were placed on the transparent electrode 405 as shown in FIG. 4 by means of a wire-placing machine, and the both ends of the electrodes were fixed temporarily. Then the conductive resin layer 103 was cured and thereby the wire electrodes were fixed on the transparent electrode 405 by means of a hot pressing machine to form current collecting electrodes 404. The conductive layer 103 had a glass transition temperature of 110° C., a specific resistance of 7.2 Ω•cm, and a porosity (void volume) of 0.01 ml/g.

Further, a busbar made of a copper foil of 5 mm wide with an adhesive applied thereon was connected to the collecting electrodes 404. Anode tab portions 402, and a cathode tab portion 403 are soldered respectively to the anode and the cathode. Thus a photovoltaic device was produced which had a triple cell structure in a size of 30 cm×30 cm.

The initial properties of the photovoltaic device prepared as described above were measured as below.

The voltage-current characteristics were measured in a dark state, and the shunt resistance was determined from the gradient near the original point to be 200 kΩ•cm$^2$ in average and therefore shunting was not generated.

The solar cell characteristics were measured with simulated sunlight having a sunlight spectrum of AM 1.5 global at the light amount of 100 mW/cm$^2$ (the apparatus manufactured by SPIRE Co.). The conversion efficiency was found to be excellent and 1.05 times as large as that in Comparative Example 1 as described later, the variation was as low as 0.2%, and the yield was 98%.

The samples were modularized by lamination in a known method. The reliability test was conducted according to the Humidity-Temperature Cycle Test A-2 of JIS C-8917 (environmental test and endurance test of crystal type solar cell module). The sample was placed in a thermo-hygrostat, and was subjected to a test of 20 cycles of from −40° C. to +85° C. (at relative humidity of 85%). After the test, the properties were measured by the simulator in the same manner as in the measurement of the initial properties. The deterioration was 2.0% on average relative to the initial conversion efficiency, which is not significant.

From this example, the photovoltaic device having the electrode structure according to the present invention has excellent properties and high reliability.

COMPARATIVE EXAMPLE 1

Figure 5A:
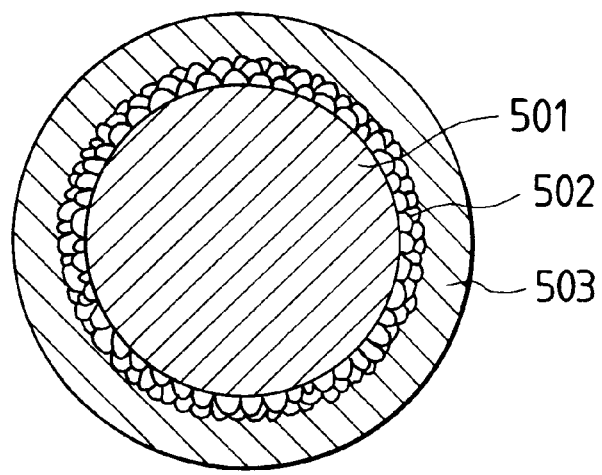
FIG. 5A and FIG. 5B are schematic sectional views illustrating the electrode of Comparative Example 1.
Figure 5B:
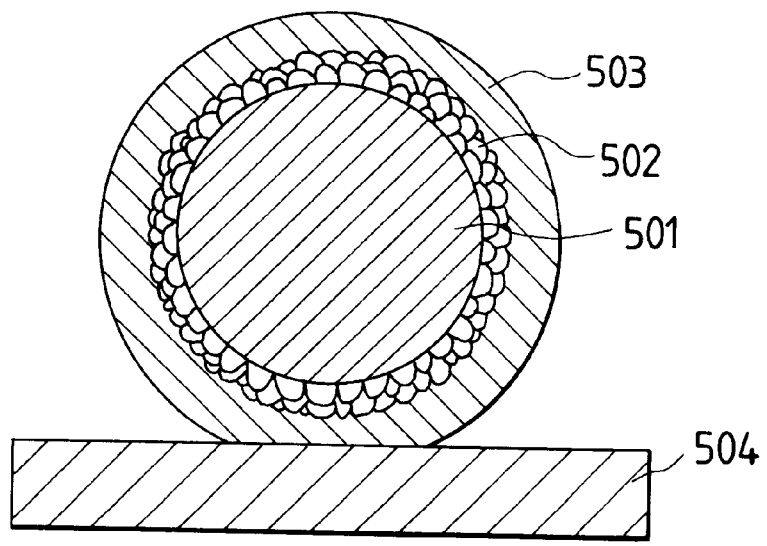

A photovoltaic device was produced in the same manner as in Example 1 except that electrodes as shown in FIG. 5A were employed. The electrode in FIG. 5A comprises a core 501, a periphery 502 formed by plating, and a conductive resin layer 503. In FIG. 5B, the numeral 504 denotes a photovoltaic cell.

A copper wire of 90 μm diameter as the core was treated for electrolytic plating in a plating bath to form a silver plating layer of 5 μm thick as the periphery 502. The silver plating bath contained a mixture of AgCN, KCN, and K$_2$CO$_3$. The temperature and the current density were controlled so as to obtain smooth plating layer. A sample of this silver-plated copper wire was observed by SEM at the cross-section and the surface thereof. Crystal particles were observed as shown in FIGS. 5A and 5B in the plating layer. The thickness of the layer was uniform, but silver crystal particles with a prticle size of 3 to 5 μm or more were found locally, and pinholes were found.

Then a conductive layer 503 was formed. A solar cell of a triple cell structure was prepared as shown in FIG. 4 in a plane form in a size of 30 cm×30 cm in the same manner as in Example 1.

The initial properties were measured in the same manner as in Example 1. The variation of the conversion efficiency was ±1.0%, somewhat larger.

Figure 6:
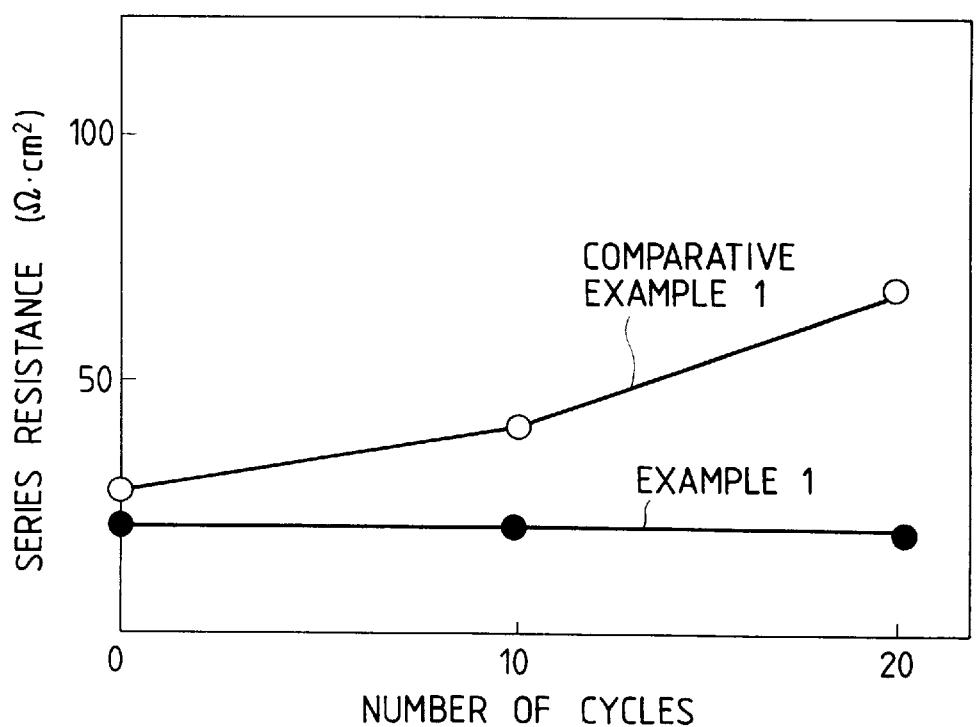
FIG. 6 is a graph showing the change of the series resistance in Example 1 and in Comparative Example 1.

The reliability test was conducted under the environment of temperature-humidity cycles in the same manner as in Example 1. The conversion efficiency after the test was deteriorated by 15% in average relative to the initial conversion efficiency. FIG. 6 is a graph showing the change of the series resistance vs. the number of the repeated cycles. The sample of Example 1 which does not contain particles with a particle size larger than 2 μm in the periphery of the electrode member did not cause change in the series resistance, whereas the sample of Comparative Example 1, which contains particles with a particle size larger than 2 μm in the periphery of the electrode member, caused increase in the series resistance by anywhere from 10% up to two times as large as that of Example 1 (10%–100% increase); After the cycle test, the cross-section and the surface of the electrode were observed by SEM; pinholes were observed, as was an oxidation film of copper in the areas of larger diameter of silver particles.

EXAMPLE 2

A photovoltaic device was produced in the same manner as in Example 1 except that a thermoplastic butyral resin was used as the resin for the conductive resin layer.

A conductive resin layer 103 was formed on a drawn silver-clad copper wire by employing a conductive resin solution which had been prepared by dispersing 25 parts by weight of carbon black, 75 parts by weight of a butyral resin, and 80 parts by weight of a mixture of IPA and ethyl acetate as the solvent by means of a paint shaker.

The conductive resin layer had a glass transition temperature of 100° C., a specific resistance of 4.2 Ω•cm, and a porosity of 0.02 ml/g.

The initial properties of the photovoltaic device after the production was measured in the same manner as in Example 1. The shunt resistance was 215 kΩ•cm$^2$ in average, and the conversion efficiency was found to be excellent and 1.05 times as large as that of Comparative Example 1. The variation was as low as 0.2%. The reliability test was conducted in the same manner as in Example 1, and showed no rise of the series resistance, and deterioration of the conversion efficiency of 2.0% in average relative to the initial efficiency. This deterioration of conversion efficiency is not significant.

EXAMPLE 3

A photovoltaic device was produced in the same manner as in Example 1 except that the conductive resin layer was constituted of two layers as shown in FIG. 1B.

The conductive resin layers 103 and 104 were formed on a silver-clad copper wire drawn in the same manner as in Example 1.

The used conductive resin was prepared as follows. A first paste for the resin layer 103 was prepared by dispersing 25 parts by weight of carbon black, 65 parts by weight of a urethane resin, 10 parts by weight of a blocked isocyanate as the curing agent, and 80 parts by weight of a mixture of IPA and ethyl acetate as the solvent by means of a paint shaker. The urethane resin employed had a glass transition temperature of 110° C.

The conductive resin layer 103 was formed from the first paste by means of a coating machine. The drying of the paste was conducted at a temperature higher than the dissociation temperature of the blocked isocyanate for complete curing. The layer thickness was 5 μm.

A second paste for the resin layer 104 was prepared by dispersing 60 parts by weight of a urethane resin, 5 parts by weight of a phenoxy resin, 10 parts by weight of a blocked isocyanate, and 85 parts by weight of a mixture of IPA and ethyl acetate. The urethane resin employed had a glass transition temperature of 110° C.

The conductive resin layer 104 was formed from the second paste by means of the coating machine in a thickness of 10 μm. The drying of the paste was conducted at a temperature lower than the dissociation temperature of the blocked isocyanate to keep the polymer uncured.

The conductive resin layer had a specific resistance of 3.2 Ω·cm, and a porosity of 0.03 ml/g. The electrode was observed by SEM to find that the formed layer was uniform without a pinhole.

The initial properties of the photovoltaic device after the production was measured in the same manner as in Example 1. The shunt resistance was 203 kΩ·cm$^2$ in average, and the conversion efficiency was found to be excellent and 1.06 times as large as that of Comparative Example 1. The variation was as low as 0.2%. The reliability test was conducted in the same manner as in Example 1, and showed no rise of the series resistance, and deterioration of the conversion efficiency of 2.0% in average relative to the initial efficiency. This deterioration of conversion efficiency is not significant.

The ion-blocking properties of the conductive resin layer 103 were confirmed by measuring current leakage in a thermo-hygrostat kept at 85° C. and 85% RH under irradiation of simulated sunlight with a sunlight spectrum of AM 1.5 global at a light amount of 100 mW/cm$^2$. During 1000 hours of measurement, no increase of the leakage current was observed. After a continuous 1000-hour measurement, the shunt resistance of the dried photovoltaic device did not become lower relative to the initial value.

EXAMPLE 4

A photovoltaic device was produced in the same manner as in Example 1 except that the periphery 102 was an ITO film.

A copper wire of 95 μm diameter as the core 101 was placed in a DC sputtering apparatus, and ITO layer was continuously formed in a layer thickness of 1 μm by using an ITO target. The layer was uniform and had no pinhole by SEM observation. On this ITO-coated copper wire, the conductive resin layer 103 was formed in the same manner as in Example 1. A photovoltaic device was produced by using this wire as the current collecting electrodes.

The initial properties of the photovoltaic device after the production was measured in the same manner as in Example 1. The shunt resistance was 195 KΩ·cm$^2$ on average, and the conversion efficiency was found to be excellent and 1.05 times as large as that of Comparative Example 1, the variation was as low as 0.1%. The reliability test was conducted in the same manner as in Example 1, and showed no rise of the series resistance and deterioration of conversion efficiency of 2.0% in average relative to the initial efficiency. This deterioration of conversion efficiency is not significant.

What is claimed is:

1. A photovoltaic device comprising a semiconductor layer, and an electrode comprising an electrode member and a conductive resin layer, wherein the electrode member comprises a core and a periphery, and the periphery contains no particles with a particle size larger than 2 μm.

2. The photovoltaic device according to claim 1, wherein the periphery has a thickness ranging from 1% to 20% of a diameter of the electrode member.

3. The photovoltaic device according to claim 1, wherein the core comprises a material selected from the group consisting of copper, copper alloys, and aluminum.

4. The photovoltaic device according to claim 1, wherein the periphery comprises a material selected from the group of silver, platinum, gold, nickel, tin, and metal oxides.

5. The photovoltaic device according to claim 1, wherein the electrode has a linear shape or a foil shape.

6. The photovoltaic device according to claim 1, wherein the electrode is formed and bonded on a light-introducing face side of the semiconductor layer.

7. The photovoltaic device according to claim 1, wherein the conductive resin layer is constituted of two or more layers.

8. The photovoltaic device according to claim 1, wherein at least the conductive resin layer in direct contact with the electrode member covers completely the electrode member.

9. The photovoltaic device according to claim 1, wherein the conductive resin layer in direct contact with the electrode member has a glass transition temperature of 100° C. or more.

10. The photovoltaic device according to claim 1, wherein the conductive resin layer has a specific resistance ranging from 0.1 to 100 Ωcm.

11. The photovoltaic device according to claim 1, wherein the conductive resin layer has a porosity of 0.04 ml/g or less in measurement of voids with a radius of 1 μm or less.

12. The photovoltaic device according to claim 1, wherein the conductive resin layer has a thickness ranging from 1% to 80% of a diameter of the electrode member.

13. The photovoltaic device according to claim 1, wherein the conductive resin layer has a stack structure constituted of two or more layers, and an outermost layer of the stack structure is composed of a thermoplastic resin or a thermosetting resin.

14. The photovoltaic device according to claim 1, wherein the conductive resin layer has a stack structure constituted of two or more layers, and the conductive resin layer in contact with the electrode member is composed of a thermosetting resin.

15. The photovoltaic device according to claim 1, wherein the periphery is formed by cladding, sputtering, or vacuum deposition.

16. The photovoltaic device according to claim 1, wherein the electrode is bonded and fixed to the surface of the semiconductor layer.

17. The photovoltaic device according to claim 1, wherein the electrode is bonded and fixed to a transparent conductive film formed on the surface of the semiconductor layer.

* * * * *

UNITED STATES PATENT AND TRADEMARK OFFICE
CERTIFICATE OF CORRECTION

PATENT NO. : 6,008,451

DATED : December 28, 1999

INVENTOR(S): HIROFUMI ICHINOSE, ET AL.

Page 1 of 2

It is certified that error appears in the above-identified patent and that said Letters Patent is hereby corrected as shown below:

COVER PAGE AT ITEM [57] ABSTRACT:
Line 8, "long use term." should read --long-term use.--.

COLUMN 1:
Line 8, "a long use term." should read --long-term use.--.

COLUMN 2:
Line 3, "a long use term," should read --long-term use,--;
Line 30, "a long use" should read --long-term use.--;
Line 31, "term " should be deleted; and
Line 53, "a long" should read --long- --.

COLUMN 3:
Line 58, "preferable" should read --preferably--.

COLUMN 5:
Line 23, "no pinhole" should read --pinholes--;
Line 50, "cells." should read --cell.--; and
Line 62, "accoding" should read --according--.

UNITED STATES PATENT AND TRADEMARK OFFICE
CERTIFICATE OF CORRECTION

PATENT NO. : 6,008,451

DATED : December 28, 1999

INVENTOR(S): HIROFUMI ICHINOSE, ET AL.

It is certified that error appears in the above-identified patent and that said Letters Patent is hereby corrected as shown below:

COLUMN 6:
Line 7, "Ti," (1st occurrence) should be deleted;
Line 19, "a" should read --an--; and
Line 46, "Priodic" should read --Periodic--.

COLUMN 8:
Line 29, "enameld" should read --enameled--.

COLUMN 9:
Line 4, "the both" should read --both--.

COLUMN 11:
Line 58, "in" should read --on--.

Signed and Sealed this

Twenty-seventh Day of February, 2001

Attest:

NICHOLAS P. GODICI

*Attesting Officer*    *Acting Director of the United States Patent and Trademark Office*